(12) United States Patent
Rhodes et al.

(10) Patent No.: US 10,913,369 B2
(45) Date of Patent: Feb. 9, 2021

(54) CHARGING ENERGY RECAPTURE ASSEMBLY AND METHOD

(71) Applicant: Ford Global Technologies, LLC, Dearborn, MI (US)

(72) Inventors: Kevin James Rhodes, Dearborn, MI (US); Erik J. Christen, Royal Oak, MI (US); Pallav Sohoni, Farmington Hills, MI (US); Joseph Giacchina, Davison, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 791 days.

(21) Appl. No.: 15/434,645

(22) Filed: Feb. 16, 2017

(65) Prior Publication Data

US 2018/0229616 A1 Aug. 16, 2018

(51) Int. Cl.
| | |
|---|---|
| *B60L 53/14* | (2019.01) |
| *B60L 58/26* | (2019.01) |
| *B60L 53/18* | (2019.01) |
| *B60L 53/31* | (2019.01) |
| *B60L 53/50* | (2019.01) |
| *H01L 35/28* | (2006.01) |
| *F24D 7/00* | (2006.01) |

(52) U.S. Cl.
CPC .............. *B60L 53/14* (2019.02); *B60L 53/18* (2019.02); *B60L 53/31* (2019.02); *B60L 53/50* (2019.02); *B60L 58/26* (2019.02); *F24D 7/00* (2013.01); *H01L 35/28* (2013.01); *Y02T 10/70* (2013.01); *Y02T 10/7072* (2013.01); *Y02T 90/12* (2013.01); *Y02T 90/14* (2013.01); *Y02T 90/16* (2013.01)

(58) Field of Classification Search
CPC .......... B60L 53/50; B60L 53/18; B60L 58/26; B60L 53/31; B60L 53/14; B60L 53/30; F24D 7/00; H01L 35/28; Y02T 10/70; Y02T 10/7072; Y02T 90/12; Y02T 90/14; Y02T 90/16; Y02E 60/10; H01M 10/625; H01M 10/66; H02N 11/002
USPC .................................................. 320/150, 109
See application file for complete search history.

(56) References Cited

U.S. PATENT DOCUMENTS

| | | | | |
|---|---|---|---|---|
| 6,138,466 A | * | 10/2000 | Lake | .................... H01M 10/625 |
| | | | | 62/199 |
| 6,332,497 B1 | * | 12/2001 | Niwa | .................. B60H 1/00007 |
| | | | | 165/204 |
| 8,022,663 B2 | * | 9/2011 | Davis | ....................... H02J 7/345 |
| | | | | 320/104 |

(Continued)

FOREIGN PATENT DOCUMENTS

| | | |
|---|---|---|
| JP | 5127426 | 7/2009 |
| JP | 5335063 | 7/2013 |

*Primary Examiner* — M Baye Diao
(74) *Attorney, Agent, or Firm* — David Kelley, Esq.; Carlson, Gaskey & Olds, P.C.

(57) ABSTRACT

An exemplary charging energy recapture assembly includes a fluid loop outside a traction battery of an electrified vehicle. The fluid loop communicates a charger fluid through a charger to the electrified vehicle and returns the charger fluid to a charging station without combining the charger fluid with a vehicle fluid. An exemplary charging energy recapture method includes circulating a charger fluid through a charger between a charging station and an electrified vehicle without the charger fluid commingling with a vehicle fluid or communicating through a traction battery of the electrified vehicle.

16 Claims, 3 Drawing Sheets

(56) References Cited

U.S. PATENT DOCUMENTS

| | | | | |
|---|---|---|---|---|
| 8,098,044 B2 * | 1/2012 | Taguchi | | B60L 58/26 |
| | | | | 320/109 |
| 8,868,270 B2 * | 10/2014 | Takahashi | | B60L 58/12 |
| | | | | 701/22 |
| 8,887,843 B2 * | 11/2014 | Piccard | | B60H 1/00278 |
| | | | | 180/65.21 |
| 9,114,714 B2 * | 8/2015 | Pham | | B60L 58/21 |
| 9,233,618 B2 | 1/2016 | Dyer et al. | | |
| 9,260,025 B1 | 1/2016 | McGrath | | |
| 9,266,433 B2 * | 2/2016 | Bilezikjian | | B60L 3/0046 |
| 9,463,701 B2 * | 10/2016 | Hakeem | | B60L 11/1816 |
| 9,630,518 B2 * | 4/2017 | Gibeau | | H02J 7/007 |
| 10,086,709 B2 * | 10/2018 | Roberts | | B60K 6/48 |
| 10,543,734 B2 * | 1/2020 | Porras | | B60H 1/00385 |
| 2005/0167169 A1 * | 8/2005 | Gering | | F01P 3/20 |
| | | | | 237/12.3 B |
| 2008/0308335 A1 * | 12/2008 | Anderson | | B60K 1/00 |
| | | | | 180/165 |
| 2009/0071428 A1 * | 3/2009 | Kamiyama | | F01P 11/20 |
| | | | | 123/142.5 R |
| 2012/0025762 A1 * | 2/2012 | Lienkamp | | H01M 10/63 |
| | | | | 320/109 |
| 2013/0029193 A1 * | 1/2013 | Dyer | | H01M 10/486 |
| | | | | 429/62 |
| 2013/0047616 A1 | 2/2013 | Holmes et al. | | |
| 2013/0166119 A1 * | 6/2013 | Kummer | | B60L 58/26 |
| | | | | 701/22 |
| 2014/0021914 A1 * | 1/2014 | Martin | | B60L 58/27 |
| | | | | 320/109 |
| 2014/0121866 A1 * | 5/2014 | Dangler | | H02J 7/0029 |
| | | | | 701/22 |
| 2014/0266038 A1 * | 9/2014 | Gibeau | | H01M 10/443 |
| | | | | 320/109 |
| 2014/0292260 A1 | 10/2014 | Dyer et al. | | |
| 2016/0372806 A1 * | 12/2016 | Lee | | H01M 10/625 |
| 2017/0174086 A1 * | 6/2017 | van de Loo | | B60L 53/18 |
| 2017/0232865 A1 * | 8/2017 | Christen | | H01M 10/625 |
| | | | | 429/120 |
| 2018/0030865 A1 * | 2/2018 | Amin | | B60K 6/40 |

\* cited by examiner

CHARGING ENERGY RECAPTURE ASSEMBLY AND METHOD

TECHNICAL FIELD

This disclosure relates generally to charging a traction battery of an electrified vehicle and, more particularly, to utilizing thermal energy generated during the charging, particularly a direct current charge.

BACKGROUND

Electrified vehicles differ from conventional motor vehicles because electrified vehicles are selectively driven using one or more electric machines powered by a traction battery. The electric machines can drive the electrified vehicles instead of, or in addition to, an internal combustion engine. Example electrified vehicles include hybrid electric vehicles (HEVs), plug-in hybrid electric vehicles (PHEVs), fuel cell vehicles (FCVs), and battery electric vehicles (BEVs).

The traction battery is a relatively high-voltage traction battery that selectively powers the electric machines and other electrical loads of the electrified vehicle. Some electrified vehicles can be periodically coupled to a charging station through a charger. The charging station recharges the traction battery through the charger. Thermal energy is generated within the electrified vehicle during the charging, particularly direct current (DC) charging.

SUMMARY

A charging energy recapture assembly according to an exemplary aspect of the present disclosure includes, among other things, a fluid loop outside a traction battery of an electrified vehicle. The fluid loop communicates a charger fluid through a charger to the electrified vehicle and returns the charger fluid to a charging station without combining the charger fluid with a vehicle fluid.

In a further non-limiting embodiment of the foregoing assembly, the fluid loop is a first fluid loop. The assembly further includes a second fluid loop that is entirely contained within the electrified vehicle and is configured to communicate the vehicle fluid through the traction battery.

In a further non-limiting embodiment of any of the foregoing assemblies, the first and second fluid loops extend through a thermal exchange device of the electrified vehicle, and the vehicle fluid takes on thermal energy from the traction battery that is then passed from the vehicle fluid to the charger fluid within the thermal exchange device.

In a further non-limiting embodiment of any of the foregoing assemblies, the charger is a DC charger that charges the traction battery with direct current provided by the charging station.

In a further non-limiting embodiment of any of the foregoing assemblies, the charger fluid is outside the electrified vehicle and the vehicle fluid is inside the vehicle when the charger is decoupled from the electrified vehicle.

In a further non-limiting embodiment of any of the foregoing assemblies, the assembly includes a thermal exchange device outside the electrified vehicle that takes on thermal energy from the charger fluid that is returned to the charging station from the electrified vehicle.

In a further non-limiting embodiment of any of the foregoing assemblies, thermal energy extracted from the charger fluid at the thermal exchange device is transferred to ambient air.

In a further non-limiting embodiment of any of the foregoing assemblies, the assembly includes a supply of water that is separate from the charger fluid and outside the electrified vehicle. Thermal energy from the charger fluid is used to heat the supply of water.

In a further non-limiting embodiment of any of the foregoing assemblies, the assembly includes an interior area of a building. Thermal energy in the charger fluid that is returned to the charging station is used to heat the interior area.

In a further non-limiting embodiment of any of the foregoing assemblies, the interior area is adjacent a floor of the building, and the charger fluid that is returned to the charging station is passed through a pipe system beneath the floor to permit the thermal energy in the charger fluid to heat the floor.

In a further non-limiting embodiment of any of the foregoing assemblies, the assembly includes a heat sink and a thermoelectric module. The thermal energy in the charger fluid that is returned to the charging station is used to heat the heat sink to facilitate a temperature difference across the thermoelectric module. The thermoelectric module generates electrical energy in response to the temperature difference that is used to power a load external to the electrified vehicle.

A charging energy recapture method according to an exemplary aspect of the present disclosure includes, among other things, circulating a charger fluid through a charger between a charging station and an electrified vehicle. The circulating occurs without the charger fluid commingling with a vehicle fluid or communicating through a traction battery of the electrified vehicle.

In a further non-limiting embodiment of the foregoing method, the method includes circulating the vehicle fluid through the traction battery, and transferring thermal energy from the vehicle fluid to the charger fluid at a position outside of the traction battery.

In a further non-limiting embodiment of any of the foregoing methods, the method includes transferring thermal energy from the vehicle fluid to the charger fluid using a thermal exchange device within the electrified vehicle.

In a further non-limiting embodiment of any of the foregoing methods, the method includes transferring thermal energy from the charger fluid to ambient air at a position outside of the electrified vehicle.

In a further non-limiting embodiment of any of the foregoing methods, the method includes heating a supply of water using thermal energy from the charger fluid.

In a further non-limiting embodiment of any of the foregoing methods, the method includes heating an interior area of a building using thermal energy from the charger fluid.

In a further non-limiting embodiment of any of the foregoing methods, the method includes heating the interior area by communicating the charger fluid received from the electrified vehicle through a pipe system beneath a floor of the building.

In a further non-limiting embodiment of any of the foregoing methods, the method includes using the charger fluid from the electrified vehicle to facilitate a temperature difference across a thermoelectric module, and generating electrical energy with the thermoelectric module that is used to power a load external to the electrified vehicle.

In a further non-limiting embodiment of any of the foregoing methods, the method includes charging the traction battery with direct current that is moved through the charger.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure is directed toward utilizing thermal energy generated when charging an electrified vehicle. Thermal energy is moved from the electrified vehicle through a charger. The thermal energy can be utilized in various ways.

Figure 1:
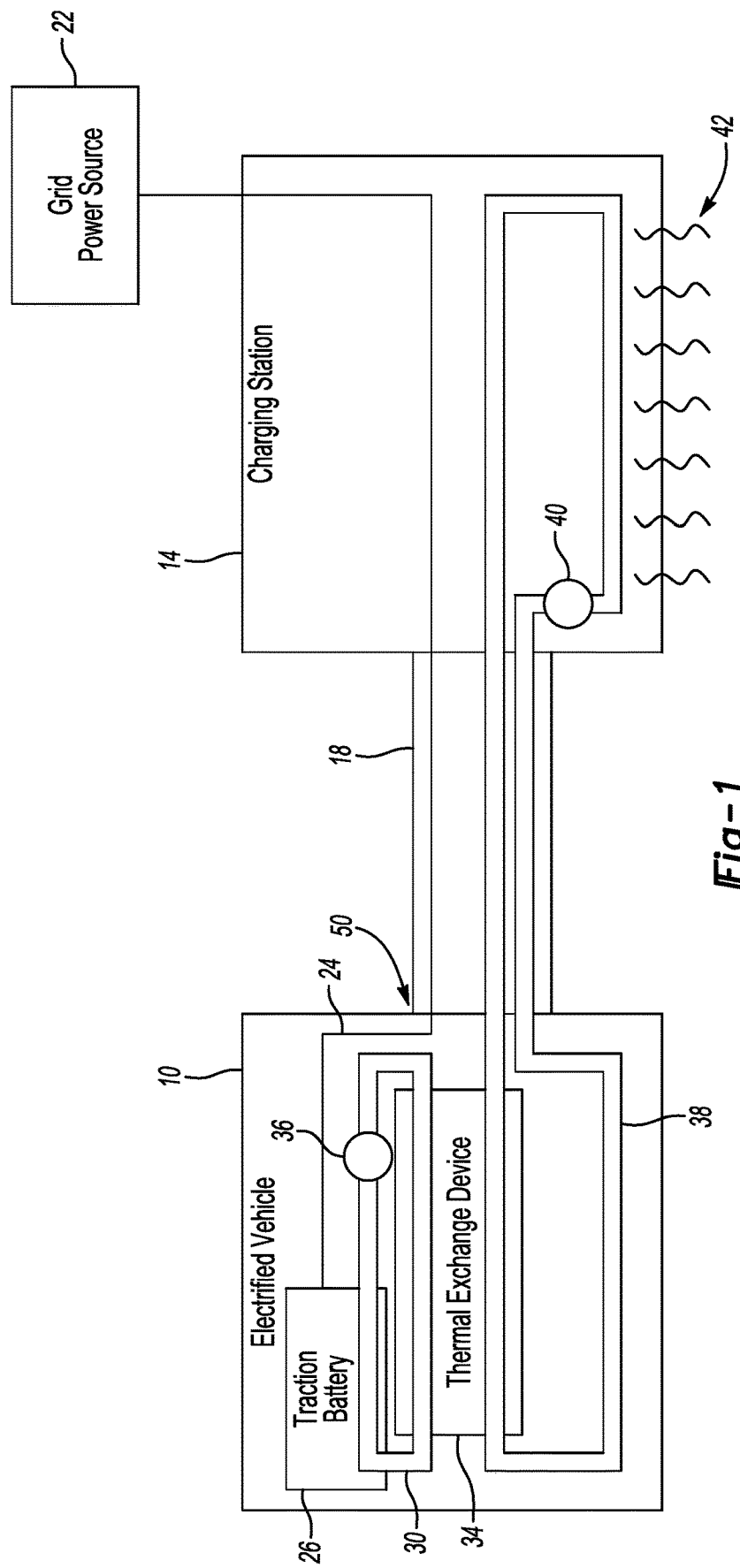
FIG. 1 illustrates a highly schematic view of an electrified vehicle charging at a charging station.

FIG. 1 schematically illustrates an electrified vehicle 10 and a charging station 14. The electrified vehicle 10 is a plug-in hybrid electric vehicle (PHEV). A charger 18 connects the electrified vehicle 10 to the charging station.

Although depicted as PHEV, it should be understood that the concepts described herein are not limited to PHEVs and could extend to any other type of electrified vehicle that is charged from a source of power outside the electrified vehicle, including, but not limited to, battery electric vehicles (BEVs).

Electrical energy flows, in this exemplary embodiment, from a grid power source 22 to the charging station 14. The electrical energy then flows through the charger 18 to the electrified vehicle 10. Within the electrified vehicle 10, the electrical energy flows along a path 24 to a traction battery 26 and recharges the traction battery 26.

The charger 18 is shown in a coupled position with the electrified vehicle 10. The charger 18 is coupled to the electrified vehicle 10 when charging the traction battery 26 with electrical energy from the grid power source 22. The charger 18 is decoupled from the electrified vehicle 10 when a driver, for example, drives the electrified vehicle 10.

Charging the traction battery 26 generates thermal energy. The electrified vehicle 10 includes a vehicle fluid that is used to move the generated thermal energy away from the traction battery.

The vehicle fluid flows along a fluid loop 30 that extends through a portion the traction battery 26 and a thermal exchange device 34. A pump 36, for example, can circulate the vehicle fluid along the fluid loop 30 between the traction battery 26 and the thermal exchange device 34.

The charging of the traction battery 26 heats the vehicle fluid of the fluid loop 30 that is within the traction battery 26. The heated vehicle fluid is then moved to the thermal exchange device 34 where thermal energy is transferred from the heated vehicle fluid, which cools the vehicle fluid.

In this example, thermal energy from the vehicle fluid in the fluid loop 30 is transferred to a charger fluid within a fluid loop 38 at the thermal exchange device 34. The fluid loop 38 with the charger fluid extends from the charging station 14, through the charger 18, into the electrified vehicle 10 and through the thermal exchange device 34.

The charger fluid circulates between the charging station 14 and the electrified vehicle 10 through the fluid loop 38. A pump 40, for example, can be used to circulate the charger fluid along the fluid loop 38.

The charger fluid in the fluid loop 38 is heated within the thermal exchange device 34 by thermal energy from the vehicle fluid within the fluid loop 30. The charger fluid that is heated at the thermal exchange device 34 is circulated back through the charger 18 to the charging station 14. Thermal energy is then extracted from the charger fluid within the fluid loop 38 at area 42. Thermal energy extracted from the charger fluid within the fluid loop 38 can be utilized for various purposes, or simply transferred to the ambient air.

For purposes of this disclosure, vehicle fluid refers to a fluid within the electrified vehicle 10 that is intended to stay within the electrified vehicle 10 at the completion of a charging procedure when the charger 18 is decoupled from the electrified vehicle 10. Exemplary vehicle fluids include coolants. The coolant can be liquid or a gas. The vehicle fluid could be, for example, a glycol/water mix.

The charger fluid, for purposes of this disclosure, refers to fluid that is outside the electrified vehicle 10 when the charger 18 is decoupled from the electrified vehicle 10. When the charger 18 couples to the electrified vehicle 10 during a charge, the charger fluid can enter the electrified vehicle 10. Exemplary charger fluids include coolants. The coolant can be liquid or a gas. The vehicle fluid could be, for example, a glycol/water mix.

In this exemplary embodiment, the charger fluid that is within the portion of the fluid loop 38 within the electrified vehicle 10 is substantially removed from the electrified vehicle 10 prior to decoupling the charger 18 from the electrified vehicle 10. The pump 40, for example, could be used to both purge the charger fluid within the electrified vehicle 10 prior to decoupling the charger from the electrified vehicle 10, and to then reintroduce charger fluid to the electrified vehicle 10 during a subsequent charge.

In other examples, some portion of the charger fluid may remain within the fluid loop 38 within the electrified vehicle 10 after the charger 18 is decoupled from the electrified vehicle 10. Such charger fluid would still not be considered a vehicle fluid, however, since the charger fluid remaining in the fluid loop 38 after the charger 18 is decoupled from the electrified vehicle 10 is not utilized by the electrified vehicle 10 when the charger 18 is decoupled from the electrified vehicle 10.

Notably, the fluid loop 30 is contained entirely within the electrified vehicle 10 and completely separate from the fluid loop 38 extending through the charger 18 from the charging station 14 to the electrified vehicle 10. This ensures that the charger fluid within the fluid loop 38 does not mix with the vehicle fluid within the fluid loop 30. Avoiding such a comingling of charger fluid with vehicle fluid can, among other things, prevent contaminants within the charger fluid from interfering with operations of the electrified vehicle that depend on a relatively clean and uncontaminated vehicle fluid.

The thermal exchange device 34 can be, in this example, considered a countercurrent flow, liquid-to-liquid heat exchanger since the exemplary vehicle fluid within the fluid loop 30 and the exemplary charger fluid within the fluid loop 38 are both liquids. In other examples, one or both of the vehicle fluid and the charger fluid could be a gas. In such examples, the thermal exchange device 34 could be a gas-to-liquid, liquid-to-gas, or gas-to-gas heat exchanger.

Figure 2:
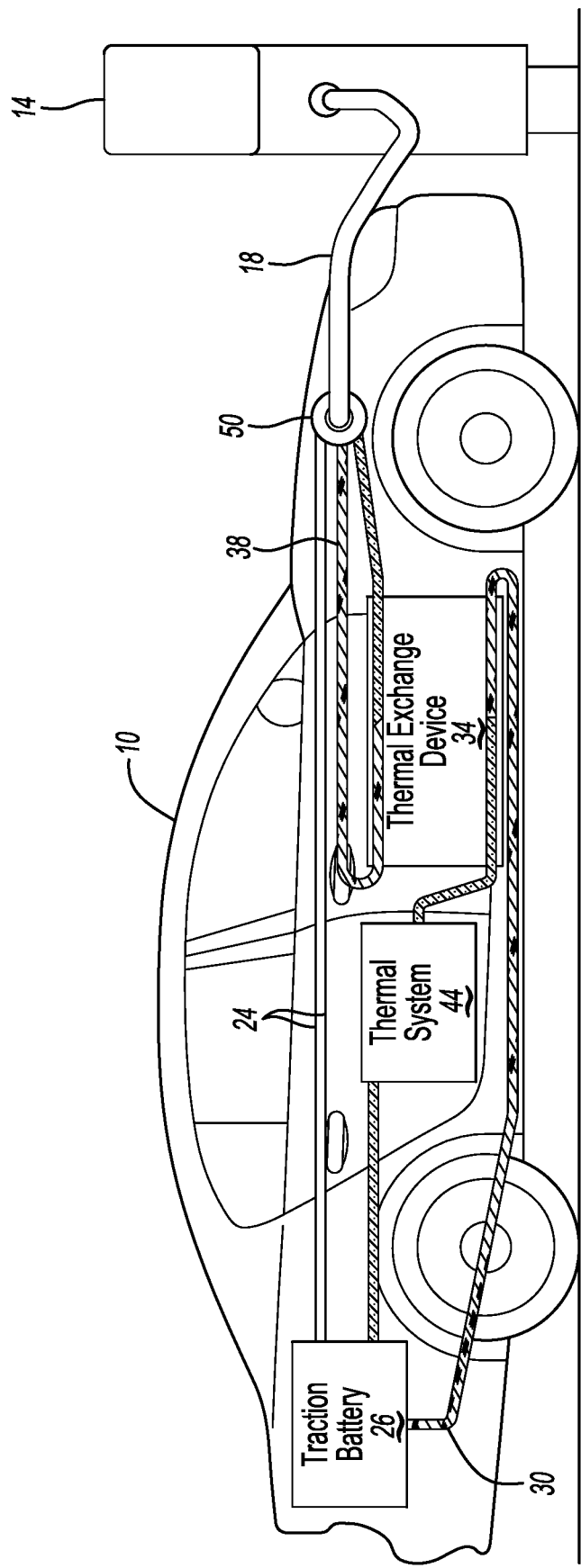
FIG. 2 illustrates a side view of the electrified vehicle and a portion of the charging station of FIG. 2.

Referring now to FIG. 2, the charger 18 is coupled to a charge port 50 of the electrified vehicle 10 during a charge. The charger 18, when coupled to the charge port 50, extends from the charging station 14 to the charge port 50.

Within the electrified vehicle 10, the path 24 extends from the charge port 50 to the traction battery 26. The path 24 is a high powered cable, for example.

In FIG. 2, the portion of the fluid loop 38 that is within the electrified vehicle 10 extends from a charger fluid vehicle inlet at the charge port 50 to the thermal exchange device 34 and back to a charger fluid vehicle outlet at the charge port 50.

Notably, the charger 18, in this exemplary embodiment, includes both the electrical connection to the traction battery 26 and the fluid connection to the portion of the fluid loop 38 residing within the electrified vehicle 10. Thus, an operator need only to couple the charger 18 to the charge port 50 to complete an electrical path to the traction battery 26 and to complete the fluid loop 38 that circulates the charger fluid between the charging station 14 and the electrified vehicle 10. In another embodiment, the charger 18 could include a first portion with the electrical connection to the traction battery 26, and a separate, second section with the fluid connection to the portion of the fluid loop 38 residing within the electrified vehicle 10.

The fluid loop 30 having the vehicle fluid extends from the traction battery 26 to the thermal exchange device 34. In this example, the fluid loop 30 additionally extends through a thermal system 44 of the electrified vehicle 10 prior to being reintroduced to the traction battery 26. The thermal system 44 could include a portion of an HVAC system for the electrified vehicle 10.

Figure 3:
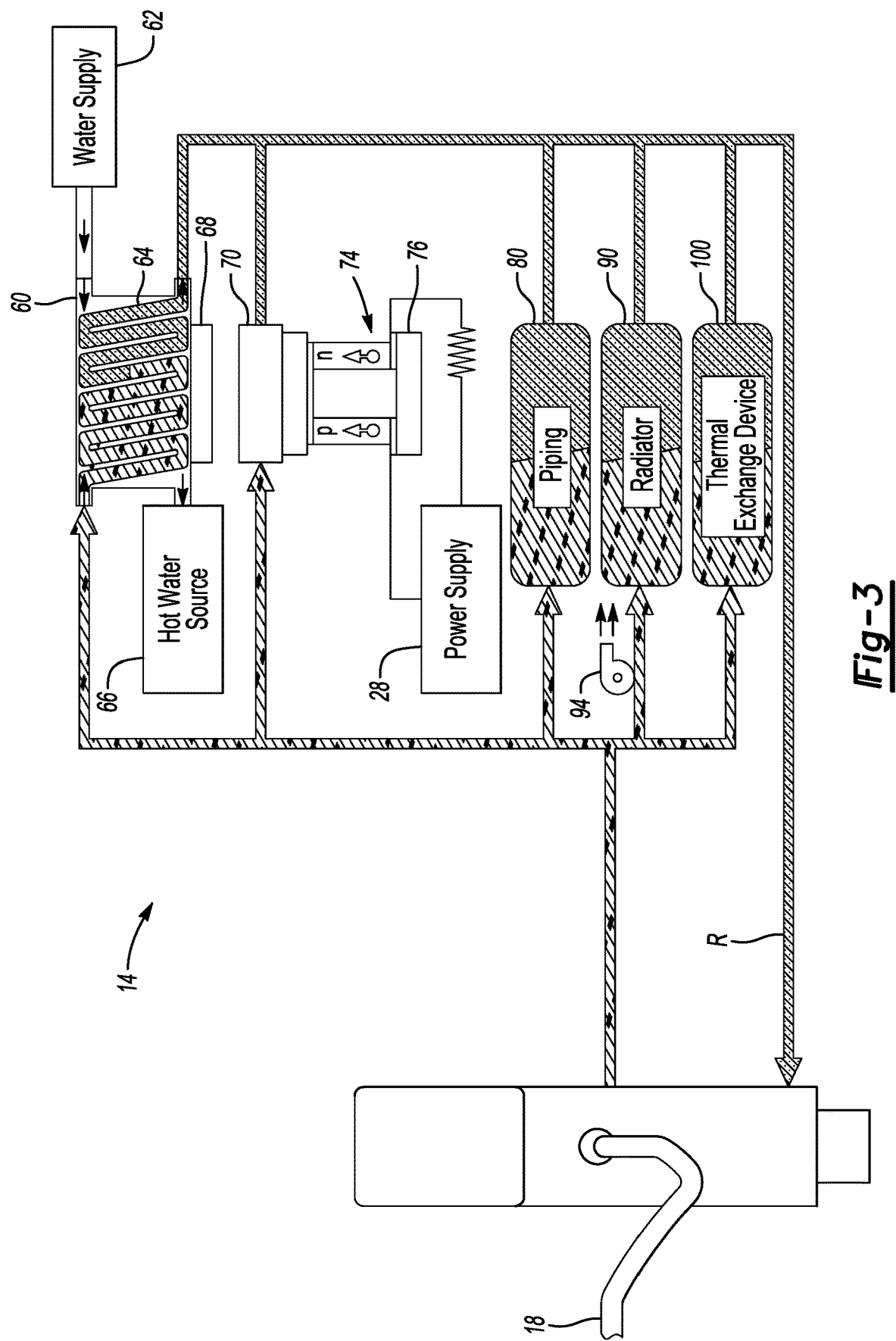
FIG. 3 illustrates exemplary uses for thermal energy generated when charging the electrified vehicle at the charging station of FIGS. 1 and 2.

Referring now to FIG. 3, thermal energy from the charger fluid within the fluid loop 38 can be utilized for various purposes at the charging station 14. In a first example, charger fluid moves from the charger 18 to a water tank 60 where thermal energy from the charger fluid is routed through one or more pipes 64 held within the water tank 60. The water tank 60 receives relatively cold water from a water supply 62. The relatively cold water is heated by thermal energy from the charger fluid within the pipes 64. After moving through the pipes 64 with the water tank 60, the charger fluid returns to the charger 18 along return path R.

The water tank 60 is effectively a heat exchanger where thermal energy from the charger fluid is moved to the water held within the water tank 60. Water within the water tank 60 that is heated by the charger fluid can be routed away from the water tank 60 and then utilized as a source 66 of hot water for, for example, a residential or commercial building. Heating the water with the thermal energy from the charger fluid reduces a required amount of heating from other water heating sources 68, such as an electrical or propane source. The thermal energy from the charger fluid essentially preheats the water within the water tank 60 prior to using the water.

In another non-limiting embodiment, the charger fluid from the charger 18 is moved against a first heat sink 70, through bored channels in the first sink 70, or both. The first heat sink 70 can be aluminum, for example. The charger fluid from the charger 18 heats the first heat sink 70. After heating the first heat sink 70, the charger fluid returns to the charger 18 along return path R.

A first side of a thermoelectric module 74 is coupled to the first heat sink 70 and a second side of the thermoelectric module 74 is coupled to a second heat sink 76 that is not heated by the charger fluid. Heating the first heat sink 70 creates a temperature differential between the first heat sink 70 and the second heat sink 76. The thermoelectric module 74 uses the temperature differential to generate electrical energy through the thermoelectric module 74. The electrical energy from the thermoelectric module 74 can be stored in a battery and used as a power supply 78 for a residential or commercial building, or for some other use. The electrical energy from the thermoelectric module 74 could instead feed directly to an electrical system through, for example, voltage converters and regulators. The electrical energy could be used to energize a refrigeration cycle for a refrigeration system of the residential or commercial building.

In yet another non-limiting embodiment, the charger fluid from the charger 18 is moved through piping 80 beneath a floor, or other area, of a building. The heated charger fluid moving through the piping 80 heats the floor or the other area, which reduces heating energy required from other sources. After moving through the piping 80, the charger fluid returns to the charger 18 along return path R.

The charger fluid could be used to heat a tile floor and the surrounding areas within a residential home, for example. If a charge of the electrified vehicle 10 occurs overnight, a resident of the home can wake up to a warm tile floor, and an electrified vehicle 10 that is charged and ready for a drive cycle.

In another exemplary non-limiting embodiment, the charger fluid from the charger 18 is moved through a radiator 90. Thermal energy from the charger fluid radiates from the radiator 90 to heat an area, such as an interior area of a residential or commercial building. Thermal energy from the charger fluid reduces heating energy required from other sources. After moving through the radiator 90, the charger fluid returns to the charger 18 along return path R.

The radiator 90 could be a heat sink, such as an aluminum block with cooling fins and integrated flow channels. The charger fluid moves through or against the heat sink to heat the heat sink. Thermal energy from the heat sink is then transferred to the surrounding environment through the cooling fins. A blower fan 94 could be used to move a flow of air through the cooling fins, the integrated flow channels, or both. The flow of air can facilitate transfer of thermal energy to the surrounding environment.

In yet another non-limiting embodiment, the charger fluid from the charger 18 is moved through a thermal exchange device 100, and thermal energy is drawn away from the heated charger fluid and used to heat an HVAC system of a building, for example. Thermal energy from the charger fluid reduces heating energy required from other sources. After moving through the thermal exchange device 100, the charger fluid returns to the charger 18 along return path R.

The water tank 60, the thermoelectric module 74, the piping 80, the radiator 90, and the thermal exchange device 100, are shown together in FIG. 3 for drawing simplicity. As can be appreciated, the charger fluid from the charger can instead be used for only the water tank 60, only the thermoelectric module 74, only the piping 80, only the radiator 90, or only the thermal exchange device 100. Further, the charger fluid from the charger can be used for more than one, but not all, of these uses, such as for the water tank 60 and the thermal exchange device 100.

Referring again to FIG. 2, the examples of this disclosure are particularly appropriate if the electrified vehicle 10 is charged from the charging station 14 with direct current, such as during a DC fast charge procedure. As known, DC fast charges can generate higher levels of thermal energy within the traction battery 26 than a relative slower, alternating current (AC) charge.

In one non-limiting embodiment, the charging station 14 is a commercial charging station incorporating several of the chargers 18 each individually connectable to different electrified vehicles to charge the different electrified vehicles.

The commercial charging station could particularly benefit from the teachings of this disclosure due to the greater frequency of charges taking place at such a charging station relative to a residential home. That is, increasing the number of charges can increase the total amount of thermal energy generated from charges. The commercial charging station can thus obtain more thermal energy generated from charges than, for example, a charging station associated with the residential home.

A commercial charging station within a colder climate could, for example, utilize thermal energy generated from charging several different vehicles to heat the interior areas of the commercial charging station or to energize a refrigeration cycle used within the commercial charging station. This reduces the overall energy cost for heating the commercial charging station.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. A charging energy recapture assembly, comprising:
   a fluid loop that is entirely outside a traction battery of an electrified vehicle, the fluid loop configured to communicate a charger fluid through a charger to the electrified vehicle and to return the charger fluid to a charging station without combining the charger fluid with a vehicle fluid,
   wherein the fluid loop is a first fluid loop, and further comprising a second fluid loop that is entirely contained within the electrified vehicle and is configured to communicate the vehicle fluid through the traction battery,
   wherein the first and second fluid loops extend through a thermal exchange device of the electrified vehicle, and the vehicle fluid takes on thermal energy from the traction battery that is then passed from the vehicle fluid to the charger fluid within the thermal exchange device,
   wherein the thermal exchange device and the traction battery are spaced a distance from each other such that the thermal exchange device does not contact the traction battery.

2. The charging energy recapture assembly of claim 1, wherein the charger is a DC charger that charges the traction battery with direct current provided by the charging station.

3. The charging energy recapture assembly of claim 1, wherein the charger fluid is outside the electrified vehicle and the vehicle fluid is inside the vehicle when the charger is decoupled from the electrified vehicle.

4. The charging energy recapture assembly of claim 1, further comprising a thermal exchange device outside the electrified vehicle that takes on thermal energy from the charger fluid that is returned to the charging station from the electrified vehicle.

5. The charging energy recapture assembly of claim 4, wherein thermal energy extracted from the charger fluid at the thermal exchange device outside the vehicle is transferred to ambient air.

6. The charging energy recapture assembly of claim 4, further comprising an interior area of a building, wherein thermal energy in the charger fluid returned to the charging station is used to heat the interior area.

7. The charging energy recapture assembly of claim 6, wherein the interior area is adjacent a floor of the building, and the charger fluid that is returned to the charging station is passed through a pipe system beneath the floor to permit the thermal energy in the charger fluid to heat the floor.

8. The charging energy recapture assembly of claim 1, further comprising a heat sink and a thermoelectric module, wherein thermal energy in the charger fluid that is returned to the charging station is used to heat the heat sink to facilitate a temperature difference across the thermoelectric module, the thermoelectric module generating electrical energy in response to the temperature difference that is used to power a load external to the electrified vehicle.

9. A charging energy recapture assembly, comprising:
   a fluid loop outside a traction battery of an electrified vehicle, the fluid loop configured to communicate a charger fluid through a charger to the electrified vehicle and to return the charger fluid to a charging station without combining the charger fluid with a vehicle fluid; and
   a supply of water that is separate from the charger fluid and outside the electrified vehicle, wherein thermal energy from the charger fluid is used to heat the supply of water,
   wherein the fluid loop is a first fluid loop, and further comprising a second fluid loop that is entirely contained within the electrified vehicle and is configured to communicate the vehicle fluid through the traction battery,
   wherein the first and second fluid loops extend through a thermal exchange device of the electrified vehicle, and the vehicle fluid takes on thermal energy from the traction battery that is then passed from the vehicle fluid to the charger fluid within the thermal exchange device,
   wherein the thermal exchange device and the traction battery are spaced a distance from each other such that the thermal exchange device does not contact the traction battery.

10. A charging energy recapture method, comprising:
    circulating a charger fluid through a charger between a charging station and an electrified vehicle without the charger fluid commingling with a vehicle fluid or communicating through a traction battery of the electrified vehicle;
    circulating the vehicle fluid through the traction battery, and transferring thermal energy from the vehicle fluid to the charger fluid at a position outside of the traction battery; and
    transferring thermal energy from the vehicle fluid to the charger fluid using a thermal exchange device within the electrified vehicle, the thermal exchange device and the traction battery are separated by a distance from each other such that there is an open area between the thermal exchange device and the traction battery.

11. The charging energy recapture method of claim 10, further comprising transferring thermal energy from the charger fluid to ambient air at a position outside of the electrified vehicle.

12. The charging energy recapture method of claim 10, further comprising heating a supply of water using thermal energy from the charger fluid.

13. The charging energy recapture method of claim 10, further comprising heating an interior area of a building using thermal energy from the charger fluid.

14. The charging energy recapture method of claim 13, further comprising heating the interior area by communicating the charger fluid received from the electrified vehicle through a pipe system beneath a floor of the building.

15. The charging energy recapture method of claim 10, further comprising using the charger fluid from the electrified vehicle to facilitate a temperature difference across a thermoelectric module, and generating electrical energy with the thermoelectric module that is used to power a load external to the electrified vehicle.

16. The charging energy recapture method of claim 10, further comprising charging the traction battery with direct current that is moved through the charger.

* * * * *